United States Patent
Kim (10) Patent No.: US 9,424,941 B2
(45) Date of Patent: Aug. 23, 2016

(54) SEMICONDUCTOR MEMORY DEVICE WITH SENSE AMPLIFYER GROUPS AND METHOD OF OPERATION THE SAME

(71) Applicant: SK hynix Inc., Gyeonggi-do (KR)

(72) Inventor: Bo Kyeom Kim, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/299,822

(22) Filed: Jun. 9, 2014

(65) Prior Publication Data
US 2015/0200015 A1   Jul. 16, 2015

(30) Foreign Application Priority Data

Jan. 15, 2014 (KR) .................. 10-2014-0005209

(51) Int. Cl.
| | |
|---|---|
| G11C 7/10 | (2006.01) |
| G11C 16/08 | (2006.01) |
| G11C 16/26 | (2006.01) |
| G11C 7/08 | (2006.01) |

(52) U.S. Cl.
CPC .............. G11C 16/26 (2013.01); G11C 7/08 (2013.01); G11C 7/1042 (2013.01); *G11C 16/08* (2013.01); *G11C 2207/005* (2013.01)

(58) Field of Classification Search
CPC . G11C 7/1078; G11C 7/1051; G11C 7/1066; G11C 7/1072; G11C 7/1096
See application file for complete search history.

(56) References Cited

U.S. PATENT DOCUMENTS

| | | | | |
|---|---|---|---|---|
| 5,953,261 A * | 9/1999 | Furutani | .............. | G11C 7/1051 326/83 |
| 5,956,285 A * | 9/1999 | Watanabe et al. | ....... | 365/230.03 |
| 6,041,004 A * | 3/2000 | Haga | ........................ | G11C 7/06 365/189.16 |
| 6,285,611 B1 * | 9/2001 | Kang | .............................. | 365/205 |
| 6,314,042 B1 * | 11/2001 | Tomishima et al. | ...... | 365/230.03 |
| 6,421,294 B2 * | 7/2002 | Hidaka | ...................... | 365/230.01 |
| 6,445,633 B2 * | 9/2002 | Takahashi | ................ | G11C 7/06 365/189.15 |
| 6,466,508 B1 * | 10/2002 | Miyawaki | ............. | G11C 7/1021 365/230.01 |
| 6,625,079 B2 * | 9/2003 | Yahata | ................... | G11C 11/406 365/193 |
| 6,781,904 B2 * | 8/2004 | Lee | ........................... | G11C 7/12 365/207 |
| 6,813,211 B2 * | 11/2004 | Takatsuka | ................ | G11C 8/18 365/194 |
| 7,230,862 B2 * | 6/2007 | Kim et al. | ..................... | 365/194 |
| 7,613,883 B2 * | 11/2009 | Bellows et al. | ............... | 711/137 |
| 7,800,931 B2 * | 9/2010 | Min | ........................ | G11C 11/22 365/145 |

(Continued)

FOREIGN PATENT DOCUMENTS

| | | |
|---|---|---|
| KR | 1019980063298 | 10/1998 |
| KR | 1020060062429 | 6/2006 |

(Continued)

*Primary Examiner* — Huan Hoang
*Assistant Examiner* — Roberto Mancera
(74) *Attorney, Agent, or Firm* — IP & T Group LLP (57) ABSTRACT

A semiconductor memory device includes a memory cell unit including a plurality of memory banks each including a pair of a first memory bank and a second memory bank, a sense amplifier group including a plurality of sense amplifier units each including a first sense amplifier and a second sense amplifier coupled to the first memory bank and the second memory bank, respectively, and a control logic block generating a first column selection signal to transfer data of the first memory bank to the first sense amplifier and a second column selection signal to transfer data of the second memory bank to the second sense amplifier, wherein an active section of the first column selection signal overlaps an active section of the second column selection signal.

16 Claims, 8 Drawing Sheets

(56) References Cited

U.S. PATENT DOCUMENTS

| | | | | |
|---|---|---|---|---|
| 8,072,821 B2* | 12/2011 | Arai | ................ | G11C 7/1006 365/189.011 |
| 8,300,490 B2* | 10/2012 | Moriwaki | ................ | G11C 7/14 365/189.06 |
| 2001/0019512 A1* | 9/2001 | Hidaka | ................ | G11C 7/18 365/230.03 |
| 2004/0037107 A1* | 2/2004 | Matsuoka | ................ | G11C 8/16 365/149 |
| 2010/0124090 A1* | 5/2010 | Arai | ................ | G11C 11/56 365/51 |
| 2010/0124141 A1* | 5/2010 | Arai | ................ | G11C 8/16 365/230.05 |
| 2013/0163335 A1* | 6/2013 | Kim et al. | ................ | 365/185.12 |

FOREIGN PATENT DOCUMENTS

| | | |
|---|---|---|
| KR | 1020120020231 | 3/2012 |
| KR | 1020120068079 | 6/2012 |

\* cited by examiner

SEMICONDUCTOR MEMORY DEVICE WITH SENSE AMPLIFYER GROUPS AND METHOD OF OPERATION THE SAME

CROSS-REFERENCE TO RELATED APPLICATION

The present application claims priority to Korean patent application number 10-2014-0005209, filed on Jan. 15, 2014, the entire disclosure of which is incorporated herein in its entirety by reference.

BACKGROUND

1. Field of Invention

Various exemplary embodiments of the present invention relate generally to an electronic device, and more particularly, to a semiconductor memory device and a method of operating the same.

2. Description of Related Art

Non-volatile memory devices operate at relatively low write and read speeds, but they can retain the stored data regardless of power on/off conditions. Volatile memory devices are considered to operate at high write and read speeds, but they are unable to retain the stored data when the power is off. Examples of non-volatile memory include Read Only Memory (ROM), Mask ROM (MROM), Programmable ROM (PROM), Erasable Programmable ROM (EPROM), Electrically Erasable and Programmable ROM (EEPROM), flash memory, Phase-change Random Access Memory (PRAM), Magnetic RAM (MRAM), Resistive RAM (RRAM) and Ferroelectric RAM (FRAM). Flash memories are categorized into a NOR type or a NAND type.

Flash memories enjoy the advantages of both RAM and ROM. For example, flash memories may be freely programmed and erased similar to RAM. Similar to ROM, flash memories may retain the stored data even when they are not powered. Flash memories have been widely used as the storage media of portable electronic devices such as mobile phones, digital cameras, personal digital assistants (PDAs), and MP3 players.

In line with the development of storage solution products including flash memories to store data, such as solid state drive/disk (SSD) and embedded multi-media card (eMMC), the data input/output speed of a semiconductor memory device has become an increasingly important issue.

SUMMARY

Exemplary embodiments of the present invention are directed to a semiconductor memory device capable of increasing the speed of data output operations and ensuring stability of data and a method of operating the same.

A semiconductor memory device according to an embodiment of the present invention may include a memory cell unit including a plurality of memory banks each including a pair of a first memory bank and a second memory bank, a sense amplifier group including a plurality of sense amplifier units each including a first sense amplifier and a second sense amplifier coupled to the first memory bank and the second memory bank, respectively, and a control logic block generating a first column selection signal to transfer data of the first memory bank to the first sense amplifier and a second column selection signal to transfer data of the second memory bank to the second sense amplifier, wherein an active section of the first column selection signal overlaps an active section of the second column selection signal.

A semiconductor memory device according to an embodiment of the present invention may include a plurality of memory banks each including first to n-th memory cell groups, a plurality of sense amplifier groups corresponding to the plurality of memory banks, wherein each of the sense amplifier groups includes first to n-th sense amplifiers, and a control logic block generating first to n-th column selection signals to transfer data of the first to n-th memory cell groups to the first to n-th sense amplifiers, respectively, wherein active sections of the first to n-th column selection signals overlap each other.

A method of operating a semiconductor memory device according to an embodiment of the present invention may include sensing data stored in a first memory cell group and a second memory cell group and temporarily storing sensed data in a first page buffer unit and a second page buffer unit, respectively, transferring data stored in the first page buffer unit to first input/output data lines during a first period in response to a first column selection signal and transferring data stored in the second page buffer unit to second input/output data lines during a second period in response to a second column selection signal, wherein the first and second periods overlap each other, sensing data transferred to the first input/output data lines and the second input/output data lines and storing sensed data in a first sense amplifier and a second sense amplifier in response to a first strobe signal and a second strobe signal, respectively, and outputting data stored in the first and second sense amplifiers to a same data line.

A semiconductor memory device according to an embodiment of the present invention may include a control logic block suitable for generating first and second column selection signals and first and second strobe signals in response to a bank address, a memory cell unit including a plurality of memory banks each including first and second memory cell groups suitable for storing data, and first and second latch groups suitable for transferring data stored in the first and second memory cell groups to first and second input/output data lines in response to the first and second column selection signal, respectively, wherein active sections of the first and second column selection signals overlap each other.

DETAILED DESCRIPTION

Hereinafter, various embodiments will be described with reference to the accompanying drawings. In the drawings, illustrated thicknesses and lengths of components are exaggerated for convenience of illustration. In the following description, a detailed explanation of known related functions and constitutions is omitted to avoid unnecessarily obscuring the subject matter disclosed herein. Throughout the disclosure, like reference numerals correspond directly to the like numbered parts in the various figures and embodiments of the present invention.

It is also noted that in this specification, "connected/coupled" refers to one component not only directly coupling another component but also indirectly coupling another component through an intermediate component. In addition, a singular form may include a plural form, and vice versa, as long as it is not specifically mentioned. Furthermore, 'include/comprise' or 'including/comprising' used in the specification represents that one or more components, steps, operations, and elements exists or are added.

It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Figure 1:
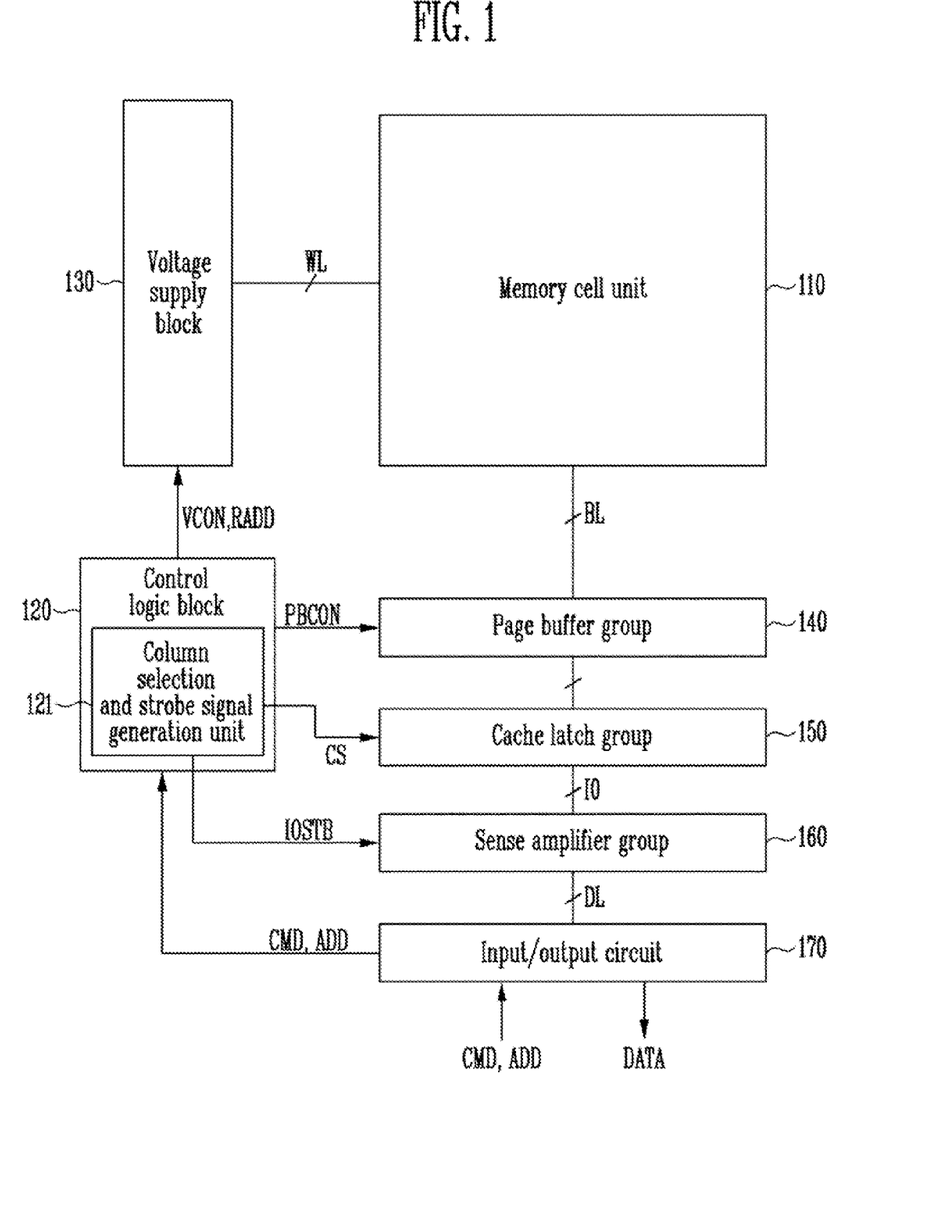
FIG. 1 is diagram illustrating a semiconductor device according to an embodiment of the present invention.

FIG. 1 is a block diagram Illustrating a semiconductor device according to an embodiment of the present invention.

Referring to FIG. 1, the semiconductor memory device according to the embodiment of the present invention may include a memory cell unit 110 and a peripheral circuit. The memory cell unit 110 may include a plurality of memory cells. The peripheral circuit may perform a read operation on selected memory cells, among the plurality of memory cells included in the memory cell unit 110. The peripheral circuit may include a control logic block 120, a voltage supply block 130, a page buffer group 140, a cache latch group 150, a sense amplifier group 160 and an input/output circuit 170.

The control logic block 120 may output a voltage control signal VCON to generate operating voltages for a read operation and a PB control signal PBCON to control page buffers included in the page buffer group 140, in response to a command signal CMD which is inputted from an external device through the input/output circuit 170. A control operation performed on the page buffer group 140 by the control logic block 120 will be described below. In addition, the control logic block 120 may output a row address signal RADD in response to an address signal ADD which is inputted from an external device through the input/output circuit 170.

The control logic block 120 may include a column selection and strobe signal generation unit 121. The column selection and strobe signal generation unit 121 may generate a column selection signal CS to control a data output operation of the cache latch group 150 so that data read during a read operation may be externally outputted. The column selection and strobe signal generation unit 121 may output a strobe signal IOSTB to control a data sensing operation of the sense amplifier group 160.

The column selection and strobe signal generation unit 121 may be included in the control logic block 120 or arranged outside the control logic block 120.

The voltage supply block 130 may generate the operating voltages for a read operation of memory cells and supply the operating voltages to the memory cell unit 110 in response to the voltage control signal VCON of the control logic block 120. The voltage supply block 130 may include a voltage generator and a row decoder.

The voltage generator may generate the operating voltages for the read operation on the memory cells in response to the voltage control signal VCON of the control logic block 120. For example, in order to perform the read operation, the voltage generator may generate a read voltage to be applied to selected memory cells and a pass voltage to be applied to unselected memory cells.

The row decoder may apply the operating voltages, generated by the voltage generator, to the selected memory cells and the unselected memory cells in response to row address signals RADD of the control logic block 120.

The page buffer group 140 may include a plurality of page buffers coupled to the memory cell unit 110 through bit lines BL. The plurality of page buffers may be grouped into a number of groups. The page buffers of the page buffer group 140 may sense voltages of the bit lines BL in order to read data from the memory cells in response to the PB control signal PBCON of the control logic block 120. For example, during a read operation, the page buffer group 140 may sense voltage variations of the bit lines BL and latch data of the memory cells corresponding to a sensing result. A detailed configuration of the page buffers will be described below.

The cache latch group 150 may include a plurality of cache latches that latch the data read by the page buffers. The cache latches may output the read data to input/output data lines IO in response to the column selection signal CS. The cache latches may be correspondingly coupled to the page buffers. Since the cache latches are to be coupled to the page buffers, the number of columns of the page buffers may be equal to the number of columns of the cache latches. A detailed configuration of the cache latches will be described below.

The sense amplifier group 160 may include a plurality of sense amplifiers that sense voltage on the input/output data lines IO and output the sensed voltage, i.e., data, to data lines DL of the input/output circuit 170 in response to the strobe signal IOSTB. A detailed configuration of the sense amplifiers will be described below.

The input/output circuit 170 may externally output data DATA transferred to the sense amplifiers included in the sense amplifier group 160 from the cache latches included in the cache latch group 150.

Figure 2:
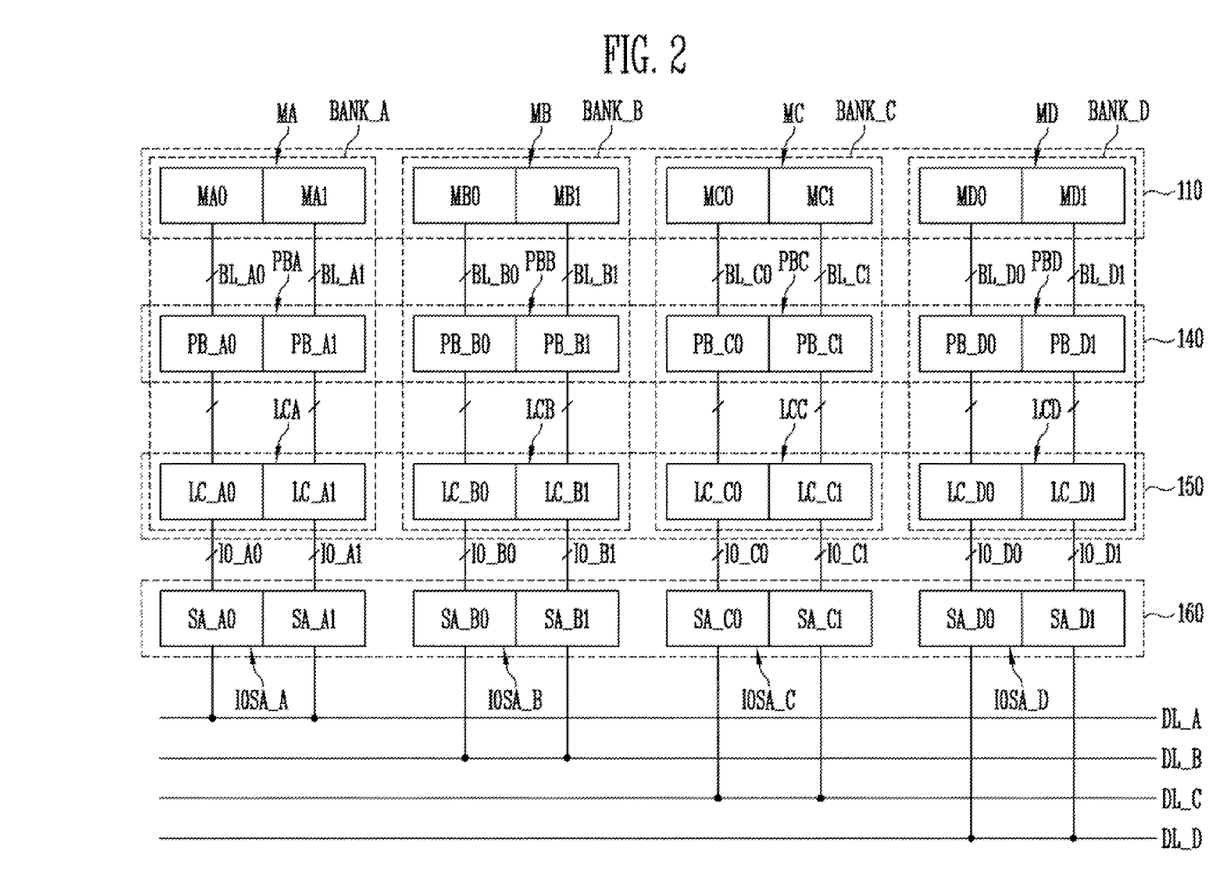
FIG. 2 is a block diagram illustrating the coupling relationship of a memory cell unit, a page buffer group, a cache latch group and a sense amplifier group.

FIG. 2 is a block diagram illustrating the coupling relationship between the memory cell unit, the page buffer group, the cache latch group and the sense amplifier group shown in FIG. 1.

Referring to FIG. 2, the memory cell unit 110 may include a plurality of memory cell groups MA, MB, MC and MD. The memory cell group MA may be divided into a first memory cell group MA0 and a second memory cell group MA1. The memory cell group MB may be divided into a first memory cell group MB0 and a second memory cell group MB1. The memory cell group MC may be divided into a first memory cell group MC0 and a second memory cell group MC1. The memory cell group MD may be divided into a first memory cell group MD0 and a second memory cell group MD1.

The page buffer group 140 may include a plurality of buffer groups PBA, PBB, PBC and PBD. The buffer group PBA may include a first page buffer unit PB_A0 and a second page buffer unit PB_A1. The first page buffer unit PB_A0 may correspond to the first memory cell group MA0 and include a plurality of page buffers coupled to bit lines BL_A0. The second page buffer unit PB_A1 may correspond to the second memory cell group MA1 and include a plurality of page buffers coupled to bit lines BL_A1. The buffer group PBB may include a first page buffer unit PB_B0 and a second page buffer unit PB_B1. The first page buffer unit PB_B0 may correspond to the first memory cell group MB0 and include a plurality of page buffers coupled to bit lines BL_B0. The second page buffer unit PB_B1 may correspond to the second memory cell group MB1 and include a plurality of page buffers coupled to bit lines BL_B1. The buffer group PBC may include a first page buffer unit PB_C0 and a second page buffer unit PB_C1. The first page buffer unit PB_C0 may correspond to the first memory cell group MC0 and include a plurality of page buffers coupled to bit lines BL_C0. The second page buffer unit PB_C1 may correspond to the second memory cell group MC1 and include a plurality of page buffers coupled to bit lines BL_C1. The buffer group PBD may include a first page buffer unit PB_D0 and a second page buffer unit PB_D1. The first page buffer unit PB_D0 may correspond to the first memory cell group MD0 and include a plurality of page buffers coupled to bit lines BL_D0. The second page buffer unit PB_D1 may correspond to the second memory cell group MD1 and include a plurality of page buffers coupled to bit lines BL_D1.

The cache latch group 150 may include a plurality of latch groups LCA, LCB, LCC and LCD. The latch group LCA may include a first latch group LC_A0 correspondingly coupled to the first page buffer unit PB_A0 and a second latch group LC_A1 correspondingly coupled to the second page buffer unit PB_A1. The latch group LCB may include a first latch group LC_B0 correspondingly coupled to the first page buffer unit PB_B0 and a second latch group LC_B1 correspondingly coupled to the second page buffer unit PB_B1. The latch group LCC may include a first latch group LC_C0 correspondingly coupled to the first page buffer unit PB_C0 and a second latch group LC_C1 correspondingly coupled to the second page buffer unit PB_C1. The latch group LCD may include a first latch group LC_D0 correspondingly coupled to the first page buffer unit PB_D0 and a second latch group LC_D1 correspondingly coupled to the second page buffer unit PB_D1.

As described above, the memory cell group MA, the buffer group PBA and the latch group LCA may be defined as a memory bank BANK_A; the memory cell group MB, the buffer group PBB and the latch group LCB may be defined as a memory bank BANK_B; the memory cell group MC, the buffer group PBC and the latch group LCC may be defined as a memory bank BANK_C; and the memory cell group MD, the buffer group PBD, and the latch group LCD may be defined as a memory bank BANK_D.

The sense amplifier group 160 may include a plurality of sense amplifier units IOSA_A, IOSA_B, IOSA_C and IOSA_D. The sense amplifier unit IOSA_A may include a first sense amplifier SA_A0 and a second sense amplifier SA_A1. The first sense amplifier SA_A0 may be coupled to the first latch group LC_A0 through an input/output data line IO_A0. The second sense amplifier SA_A1 may be coupled to the second latch group LC_A1 through an input/output data line IO_A1. The sense amplifier unit IOSA_B may include a first sense amplifier SA_B0 and a second sense amplifier SA_B1. The first sense amplifier SA_B0 may be coupled to the first latch group LC_B0 through an input/output data line IO_B0. The second sense amplifier SA_B1 may be coupled to the second latch group LC_B1 through an input/output data line IO_B1. The sense amplifier unit IOSA_C may include a first sense amplifier SA_C0 and a second sense amplifier SA_C1. The first sense amplifier SA_C0 may be coupled to the first latch group LC_C through an input/output data line IO_C0. The second sense amplifier SA_C1 may be coupled to the second latch group LC_C1 through an input/output data line IO_C1. The sense amplifier unit IOSA_D may include a first sense amplifier SA_D0 and a second sense amplifier SA_D1. The first sense amplifier SA_D0 may be coupled to the first latch group LC_D0 through an input/output data line IO_D0. The second sense amplifier SA_D1 may be coupled to the second latch group LC_D1 through an input/output data line IO_D1.

Both the first sense amplifier SA_A0 and the second sense amplifier SA_A1 may be coupled to the same data line DL_A. Both the first sense amplifier SA_B0 and the second sense amplifier SA_B1 may be coupled to the same data line DL_B. Both the first sense amplifier SA_C0 and the second sense amplifier SA_C1 may be coupled to the same data line DL_C. Both first sense amplifier SA_D0 and the second sense amplifier SA_D1 may be coupled to the same data line DL_D.

In other words, since two sense amplifiers correspond to a single memory bank, for example, the first sense amplifier SA_A0 and the second sense amplifier SA_A1 correspond to the memory bank BANK_A, a cache operation may be performed during a data output operation, so that data of the memory bank BANK_A may be quickly outputted to the data line DL_A.

Figure 3:
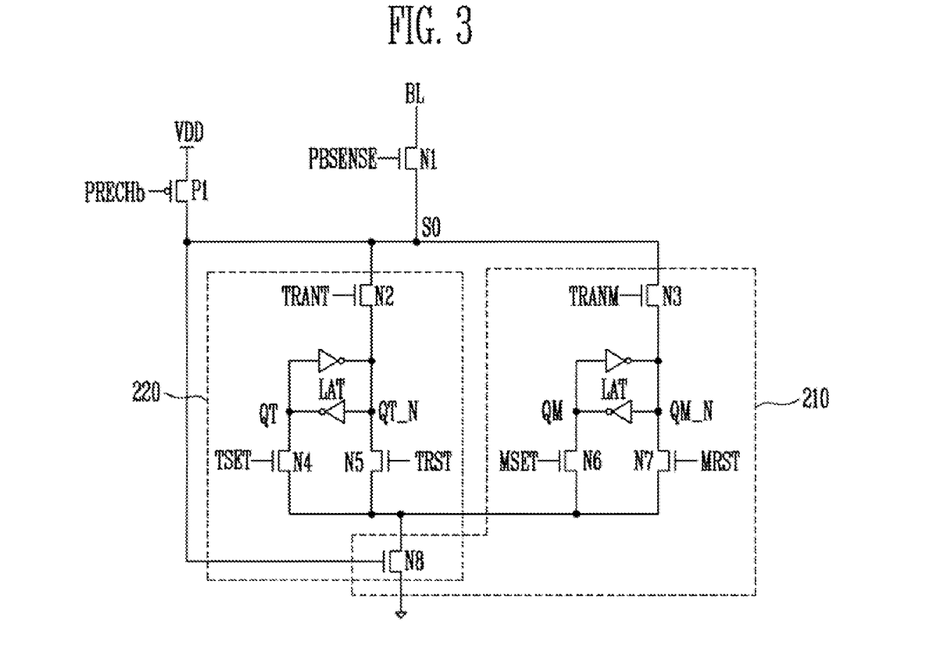
FIG. 3 is a circuit diagram illustrating a page buffer.

FIG. 3 is a circuit diagram illustrating the page buffers included in the page buffer group.

Referring to FIG. 3, the page buffer may be controlled by the control logic block 120 shown in FIG. 1. Signals (PRECHb, TRANT, TRANM, TRST, TSET, MRST, MSET and PBSENSE) to be described below may be outputted as the PB control signal PBCON from the control logic block 120.

The page buffer may include a bit line coupling unit N1, a precharge unit P1 and a plurality of latch units.

The bit line coupling unit N1 may couple the bit line BL to one of the latch units in response to a coupling signal PBSENSE. The latch units may be coupled in parallel with the bit line coupling unit N1. A connection node between the bit line coupling unit N1 and the latch units may be a sensing node SO.

The precharge unit P1 may precharge the sensing node SO in response to a precharge signal PRECHb.

The number of latch units may vary depending on a design and purpose. FIG. 3 exemplifies two latch units 210 and 220.

The first and second latch units 210 and 220 may sense a bit line voltage and latch data during a read operation. Each of the first and second latch units 210 and 220 may include a plurality of switching elements and a latch.

The first latch unit 210 may include a latch LAT, and switching elements N3, N6, N7 and N8. The latch LAT may latch data. The switching element N3 may couple a first node QM_N of the latch LAT to the sensing node SO in response to a transfer signal TRANM. The switching elements N6 and N7 may be coupled to a second node QM and the first node QM_N of the latch LAT and operate in response to a set signal MSET and a reset signal MRST, respectively. The switching element N8 may be coupled between the switching elements N6 and N7 and a ground terminal and operate in response to a potential of the sensing node SO.

The second latch unit 220 may include a latch LAT, and switching elements N2, N4, N5 and N8. The latch LAT may latch data. The switching element N2 may couple a first node QT_N of the latch LAT to the sensing node SO in response to a transfer signal TRANT. The switching elements N4 and N5 may be coupled to a second node QT and the first node QT_N of the latch LAT and operate in response to a set signal TSET and a reset signal TRST, respectively. The switching element N8 may be coupled between the switching elements N4 and N5 and a ground terminal and operate in response to the potential of the sensing node SO.

Figure 4:
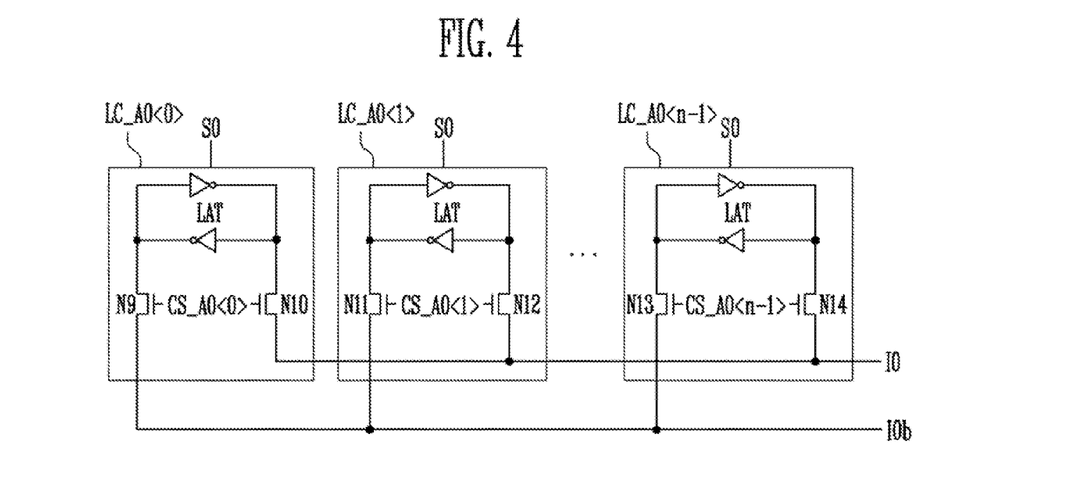
FIG. 4 is a circuit diagram illustrating a cache latch.

FIG. 4 is a circuit diagram illustrating the cache latches included in the cache latch group. FIG. 4 illustrates the first latch group LC_A0, shown in FIG. 2, as a simplified illustration.

With reference to FIG. 4, cache latches LC_A0<0> to LC_A0<n-1> may output non-inverted data of the data, transferred from the page buffers, to a main line IO of the input/output data line IO_A0 and output inverted data of the data to a sub line IOb of the input/output data line IO_A0 in response to first column selection signals CS_A0<0> to CS_A0<n-1>, respectively.

The cache latches may be correspondingly coupled to the respective page buffers through the sensing node SO. The cache latch LC_A0<0> may include a latch LAT and data output units N9 and N10. The latch LAT may latch the data transferred from the corresponding page buffer. The data output units N9 and N10 may output inverted data of the latched data to the sub line IOb of the input/output data line IO_A0 and output non-inverted data of the latched data to the main line IO of the input/output data line IO_A0 in response to the first column selection signal CS_A0<0>.

The cache latch LC_A0<1> may include a latch LAT and data output units N11 and N12. The latch LAT may latch the data transferred from the corresponding page buffer. The data output units N11 and N12 may output inverted data of the latched data to the sub line IOb of the input/output data line IO_A0 and output non-inverted data of the latched data to the main line IO of the input/output data line IO_A0 in response to the first column selection signal CS_A0<1>.

The cache latch LC_A0<n-1> may include a latch LAT and data output units N13 and N14. The latch LAT may latch the data transferred from the corresponding page buffer. The data output units N13 and N14 may output inverted data of the latched data to the sub line IOb of the input/output data line IO_A0 and output non-inverted data of the latched data to the main line IO of the input/output data line IO_A0 in response to the first column selection signal CS_A0<n-1>.

FIG. 4 illustrates the first latch group LC_A0, shown in FIG. 2, as an example. The second latch group LC_A1, shown in FIG. 2, may have the same configuration as the first latch group LC_A0. However, the second latch group LC_A1 may operate in response to a second column selection signal instead of the first column selection signal CS_A0. The second column selection signal will be described below.

Figure 5:
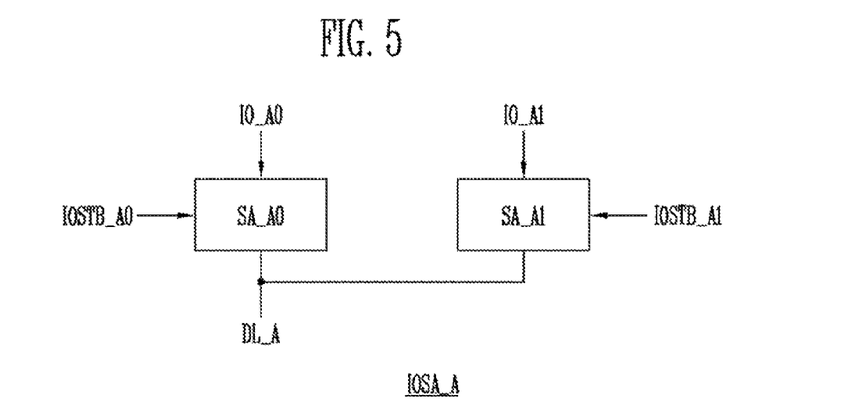
FIG. 5 is a block diagram illustrating a sense amplifier.

FIG. 5 is a block diagram illustrating a sense amplifier unit.

For example, FIG. 5 illustrates the sense amplifier unit IOSA_A for a simple illustration.

The sense amplifier unit IOSA_A may include the first sense amplifier SA_A0 coupled between the input/output data line IO_A0 and the data line DL_A and the second sense amplifier SA_A1 coupled between the input/output data line IO_A1 and the data line DL_A. The first sense amplifier SA_A0 may sense the potential of the input/output data line IO_A0 and output the sensed potential, i.e., data, to the data line DL_A in response to a first strobe signal IOSTB_A0. The second sense amplifier SA_A1 may sense the potential of the input/output data line IO_A1 and output the sensed potential, i.e., data, to the data line DL_A in response to a second strobe signal IOSTB_A1. The first strobe signal IOSTB_A0 and the second strobe signal IOSTB_A1 may be alternately activated.

Figure 6:
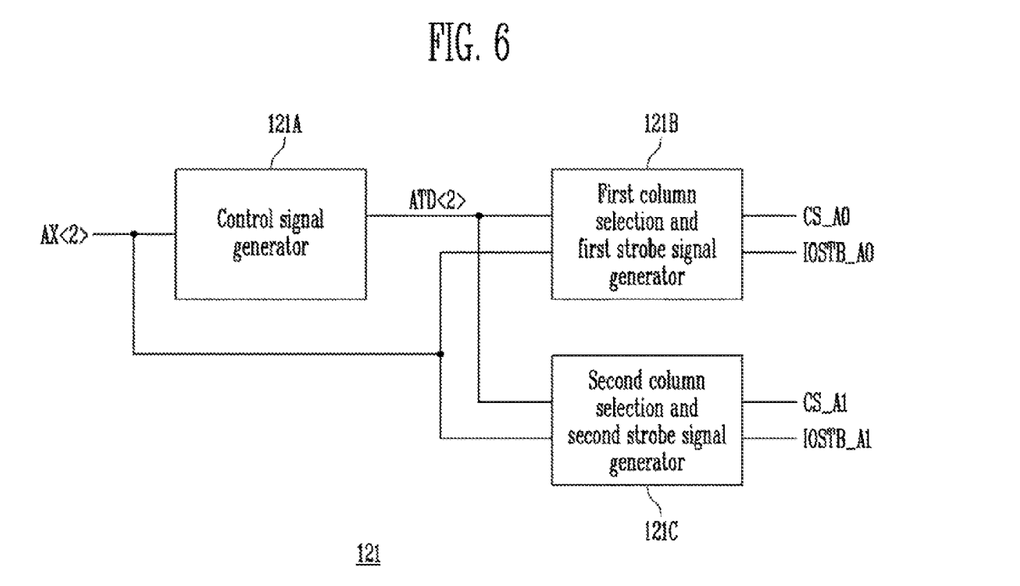
FIG. 6 is a block diagram Illustrating a column selection and strobe signal generation unit included in a control logic block.

FIG. 6 is a block diagram illustrating the column selection and strobe signal generation unit included in the control logic block.

Referring to FIG. 6, the column selection and strobe signal generation unit 121 may include a control signal generator 121A, a first column selection and first strobe signal generator 121B and a second column selection and second strobe signal generator 121C.

The control signal generator 121A may generate a control clock ATD<2> that toggles/oscillates with a predetermined period in response to a bank address AX<2> among addresses inputted to the control logic block 120. The first column selection and first strobe signal generator 121B may output the first column selection signal CS_A0 and the first strobe signal IOSTB_A0 in response to the bank address AX<2> and the control clock ATD<2>. The second column selection and second strobe signal generator 121C may output a second column selection signal CS_A1 and the second strobe signal IOSTB_A1 in response to the bank address AX<2> and the control clock ATD<2>. An active period of the first column selection signal CS_A0 may overlap an active period of the second column selection signal CS_A1. The first strobe signal IOSTB_A0 and the second strobe signal IOSTB_A1 may be alternately activated.

FIG. 6 illustrates only a single column selection and strobe signal generation unit. However, a plurality of column selection and strobe signal generation units may be provided to correspond to the respective memory banks. The column selection and strobe signal generation units may generate first and second column selection signals corresponding to each of the memory banks and first and second strobe signals corresponding to the sense amplifier unit coupled to each of the memory banks. In another example, a single column selection and strobe signal generation unit may be provided, a plurality of memory banks may use the same first and second column selection signals and a plurality of sense amplifier units may use the same first and second strobe signals.

Figure 7A:
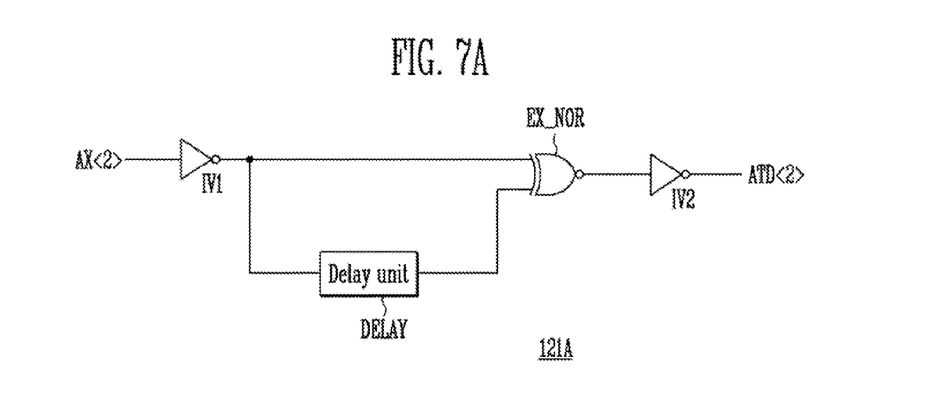
FIG. 7A is a circuit diagram illustrating a control signal generator shown in FIG. 6.

FIG. 7A is a circuit diagram illustrating the control signal generator shown in FIG. 6.

Referring to FIG. 7A, the control signal generator 121A may generate the control clock ATD<2> in response to the bank address AX<2>.

The control signal generator 121A may include inverters IV1 and IV2, a delay unit DELAY and a logic gate EX_NOR. The inverter IV1 may receive and invert the bank address AX<2>. The delay unit DELAY may receive and delay an output signal of the inverter IV1. The logic gate EX_NOR may include an exclusive NOR gate. The logic gate EX_NOR may perform a logic combination of the output signal of the inverter IV1 and an output signal of the delay unit DELAY and produce an output signal. The inverter IV2 may receive and invert an output signal of the logic gate EX_NOR, and output an inverted signal as the control clock ATD<2>.

Figure 7B:
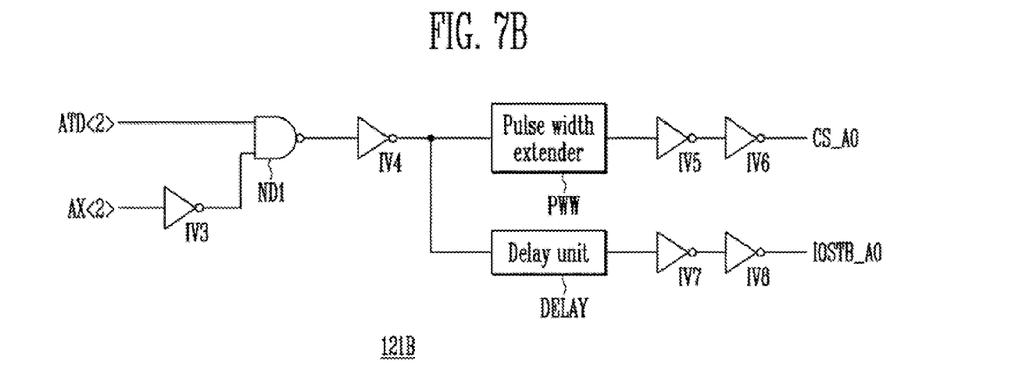
FIG. 7B is a circuit diagram illustrating a signal generator generating a first column selection signal and first strobe signal shown in FIG. 6.

FIG. 7B is a circuit diagram Illustrating the first column selection and first strobe signal generator shown in FIG. 6.

The first column selection and first strobe signal generator 121B may generate the first column selection signal CS_A0 and the first strobe signal IOSTB_A0 in response to the bank address AX<2> and the control clock ATD<2>.

The first column selection and first strobe signal generator 121B may include a plurality of inverters IV3 to IV8, a logic gate ND1, a pulse width extender PWW and a delay unit DELAY. The inverter IV3 may receive and invert the bank address AX<2>. The logic gate ND1 may perform a logic combination of the control signal ATD<2> and an output signal of the inverter IV3 and produce an output signal. The inverter IV4 may invert the output signal of the logic gate ND1. The pulse width extender PWW may receive an output signal of the inverter IV4, extend a pulse width of the output signal by a predetermined value and output the output signal with the extended pulse width. The inverter IV5 and the inverter IV6 may be coupled in series with each other, buffer an output signal of the pulse width extender PWW and output the buffered output signal as the first column selection signal CS_A0. The delay unit DELAY may receive the output signal of the inverter IV4, delay the output signal for a predetermined period of time and output the delayed output signal. The inverter IV7 and the inverter IV8 may be coupled in series with each other, buffer an output signal of the delay unit DELAY and output the buffered output signal as the first strobe signal IOSTB_A0.

Figure 7C:
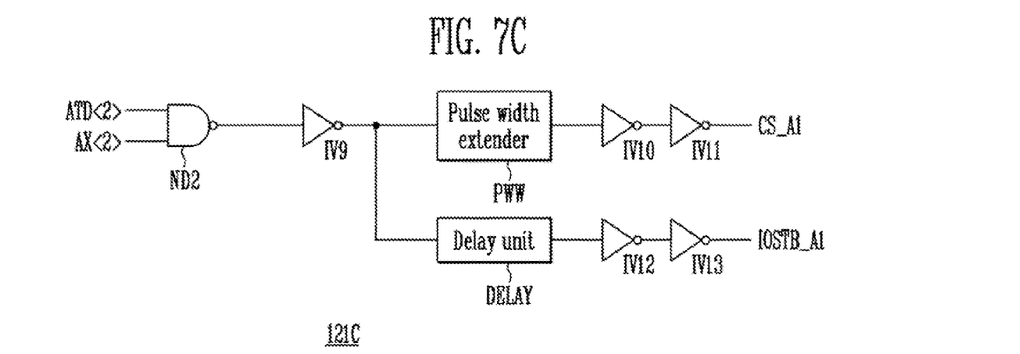
FIG. 7C is a circuit diagram illustrating a signal generator generating a second column selection signal and a second strobe signal shown in FIG. 6.

FIG. 7C is a circuit diagram illustrating the second column selection and second strobe signal generator shown in FIG. 6.

The second column selection and second strobe signal generator 121C may generate the second column selection signal CS_A1 and the second strobe signal IOSTB_A1 in response to the bank address AX<2> and the control clock ATD<2>.

The second column selection and second strobe signal generator 121C may include a plurality of inverters IV9 to IV13, a logic gate ND2, a pulse width extender PWW and a delay unit DELAY. The logic gate ND2 may perform a logic combination of the control clock ATD<2> and the bank address AX<2> and produce an output signal. The inverter IV9 may invert the output signal of the logic gate ND2 and output the inverted output signal. The pulse width extender PWW may receive an output signal of the inverter IV9, extend a pulse width of the output signal by a predetermined value and output the output signal with the extended pulse width. The inverter IV10 and the inverter IV11 may be coupled in series with each other, buffer an output signal of the pulse width extender PWW and output the buffered output signal as the second column selection signal CS_A1. The delay unit DELAY may receive the output signal of the inverter IV9, delay the output signal for a predetermined period of time and output the delayed output signal. The inverter IV12 and the inverter IV13 may be coupled in series with each other, buffer an output signal of the delay unit DELAY and output the buffered output signal as the second strobe signal IOSTB_A1.

There has been a description of an embodiment where the first and second column selection signals CS_A0 and CS_A1 and the first and second strobe signals IOSTB_A0 and IOSTB_A1, which are applied to the latch group LCA and the sense amplifier unit IOSA_A, shown in FIG. 2, are generated. However, first and second column selection signals and first and second strobe signals which are applied to other latch groups LCB, LCC and LCD and other sense amplifier units IOSA_B, IOSA_C and IOSA_D may also be generated by the same method.

In addition, the first or second column selection signals CS_A0 or CS_A1 that are applied to the latch group LCA may be generated as a plurality of signals, that is, as the plurality of column selection signals CS_A0<0> to CS_A0<n−1> which are inputted to the cache latches LC_A0<0> to LC_A0<n−1>, by controlling the activation time points thereof.

Figure 8:
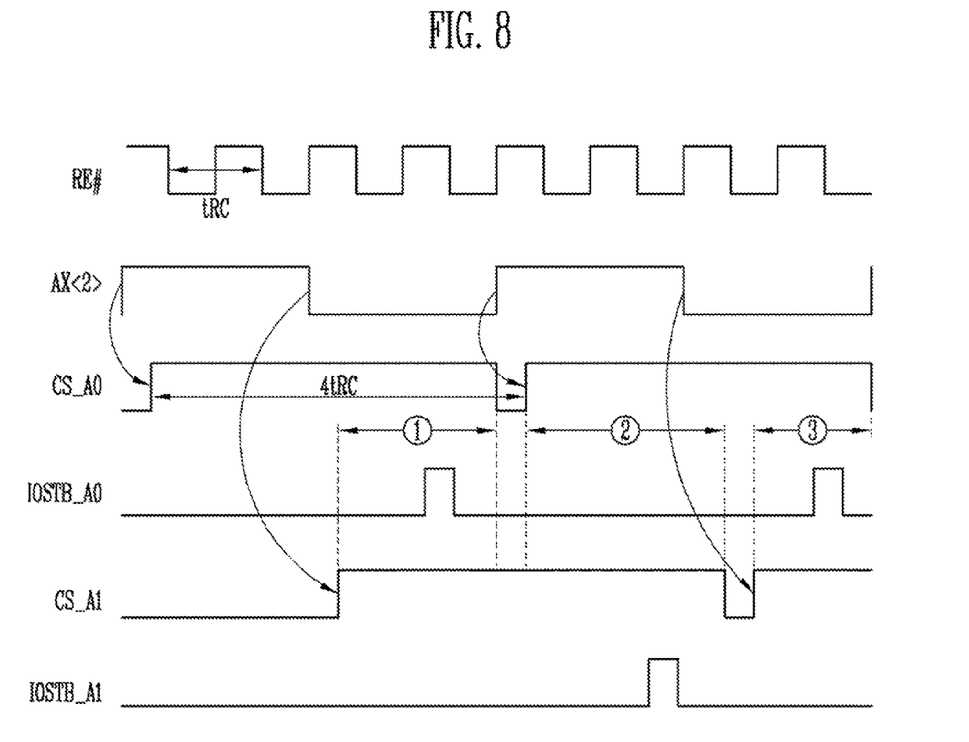
FIG. 8 is a waveform diagram for illustrating a data output operation according to an embodiment of the present invention.

FIG. 8 is a waveform diagram illustrating a data output operation according to an embodiment of the present invention.

A data read operation according to an embodiment of the present invention is described below with reference to FIGS. 1 to 8.

The control logic block 120 may output the voltage control signal VCON in order to output operating voltages for a read operation and the PB control signal PBCON to control the page buffers included in the page buffer group 140, in response to the command signal CMD externally inputted through the input/output circuit 170.

The voltage supply block 130 may generate the operating voltages for a read operation performed on memory cells and provide the operating voltages to the memory cell unit 110 in response to the voltage control signal VCON of the control logic block 120. For example, the voltage supply block 130 may generate a read voltage to be applied to selected memory cells and a pass voltage to be applied to unselected memory cells and apply the read voltage and the pass voltage to the selected memory cells and the unselected memory cells, respectively, in response to the voltage control signal VCON of the control logic block 120 during the read operation.

The page buffers included in the page buffer group 140 may sense voltages of the bit lines BL in order to read the data from the memory cells in response to the PB control signal PBCON of the control logic block 120. For example, in a read operation, the page buffer group 140 may sense a voltage variation of the bit lines BL and latch data of memory cells corresponding to a sensing result.

The data latched by the page buffer group 140 may be transferred to and latched by the cache latch group 150 coupled to the page buffer group 140.

Subsequently, the column selection and strobe signal generation unit 121, included in the control logic block 120, may generate and output column selection signals CS to transfer the data, which is stored in the cache latch group 150, to the input/output data lines IO. The column selection and strobe signal generation unit 121 may divide the column selection signal CS into the first and second column selection signals. The first and second column selection signals may be generated so that active periods thereof may overlap each other. For example, as shown in FIG. 8, active periods of the first column selection signal CS_A0 and the second column selection signal CS_A1, applied to the latch group LCA of the cache latch group 150, may overlap each other during a first period ①, a second period ② and a third period ③.

More specifically, when the bank address signal AX<2> synchronized with a read enable signal RE# that toggles/oscillates on a predetermined cycle tRC is inputted during a read operation, the column selection and strobe signal generation unit 121 may generate the control clock ATD<2> in response to the bank address signal AX<2> and generate the first column selection signal CS_A0 and the second column selection signal CS_A1 in response to the bank address signal AX<2> and the control clock ATD<2>. The first column selection signal CS_A0 and the second column selection signal CS_A1 may have the same period 4tRC and different activation timings. Thus, active periods of the first column selection signal CS_A0 and the second column selection signal CS_A1 may overlap each other during the first period ①, the second period ② and the third period ③.

Operations of outputting data to input/output data lines by the first and second latch groups included in each of the latch groups LCA, LCB, LCC and LCD of the cache latch group 150 may overlap each other during some periods. Therefore, a sufficient amount of time for the operations of outputting the data to the input/output data lines by the latch groups LCA, LCB, LCC and LCD may be ensured so that a stabilized data transfer operation may be performed. In addition, the sense amplifier units IOSA_A, IOSA_B, IOSA_C and IOSA_D of the sense amplifier group 160 corresponding to the latch groups LCA, LCB, LCC and LCD may perform a stabilized data sensing operation to improve sensing the margin.

The column selection and strobe signal generation unit 121 may activate the first column selection signal CS_A0 and the second column selection signal CS_A1 in response to a rising edge and a falling edge of the bank address signal<AX<2>. In addition, an active period of each of the first column selection signal CS_A0 and the second column selection signal CS_A1 may be smaller than a period of the bank address signal<AX<2> and greater than a half period thereof.

Subsequently, the column selection and strobe signal generation unit 121 included in the control logic block 120 may generate and output the first strobe signal IOSTB_A0 and the second strobe signal IOSTB_A1 that are alternately activated. Each of the sense amplifier units IOSA_A, IOSA_B, IOSA_C and IOSA_D of the sense amplifier group 160 may transfer the sensed data to the input/output circuit 170 through the corresponding data lines DL_A, DL_B, DL_C and DL_D in response to the first strobe signal and the second strobe signal that are alternately activated. Since the first sense amplifier and the second sense amplifier of each of the sense amplifier units IOSA_A, IOSA_B, IOSA_C and IOSA_D of the sense amplifier group 160 are coupled to a single memory bank, a cache operation of a data output operation may be performed to increase the speed of the data output operation.

The input/output circuit 170 may externally output the data DATA transferred through the data lines DL_A, DL_B, DL_C and DL_D.

As described above, a semiconductor memory device according to an embodiment of the present invention may arrange a first sense amplifier and a second sense amplifier to a single memory bank and control sensing operations of the first sense amplifier and the second sense amplifier to overlap each other, so that the time margin of the data sensing operation may improve speed and reliability of the data output operation.

Figure 9:
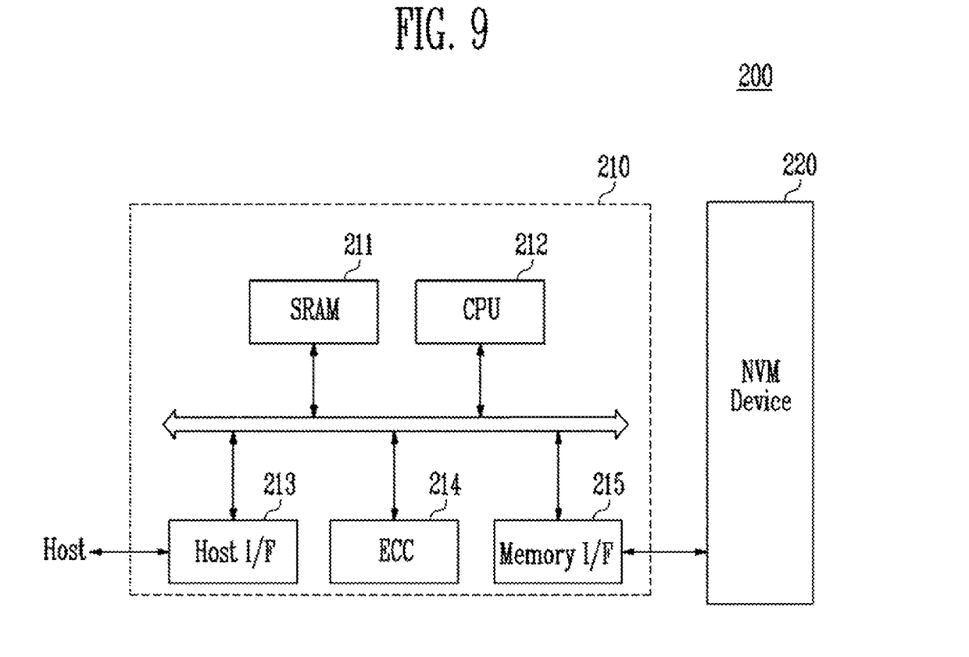
FIG. 9 is a schematic block diagram Illustrating a memory system according to an embodiment of the present invention.

FIG. 9 is a schematic block diagram illustrating a memory system according to an embodiment of the present invention.

Referring to FIG. 9, a memory system 200 according to an embodiment of the present invention may include a non-volatile memory device 220 and a memory controller 210.

The non-volatile memory device 220 may be configured by the above-described semiconductor memory device and may be operated by the above-described method for compatibility with the memory controller 210. The memory controller 210 may be configured to control the non-volatile memory device 220. The memory system 200 having the above-described configuration may be a memory card or a solid state disk (SSD) in which the non-volatile memory device 220 and the memory controller 210 are combined. An SRAM 211 may function as an operation memory of a CPU 212. A host interface 213 may include a data exchange protocol of a host being coupled to the memory system 200. An ECC 214 may detect and correct errors included in data read from the non-volatile memory device 220. A memory interface 215 may interface with the non-volatile memory device 220. The CPU 212 may perform the general control operation for data exchange of the memory controller 210.

Though not illustrated in FIG. 9, the memory system 200 may further include ROM that stores code data to interface with the host. In addition, the non-volatile memory device 220 may be a multi-chip package composed of a plurality of flash memory chips. The memory system 200 may be provided as a storage medium having high reliability and low error rate. The flash memory device according to an embodiment of the present invention may be provided in a memory system such as a semiconductor disk device (a solid state disk (SSD)) on which research has been actively conducted. For example, when the memory system 200 is an SSD, the memory controller 110 may communicate with the outside (e.g., a host) through one of the interface protocols including USB, MMC, PCI-E, SATA, PATA, SCSI, ESDI and IDE.

Figure 10:
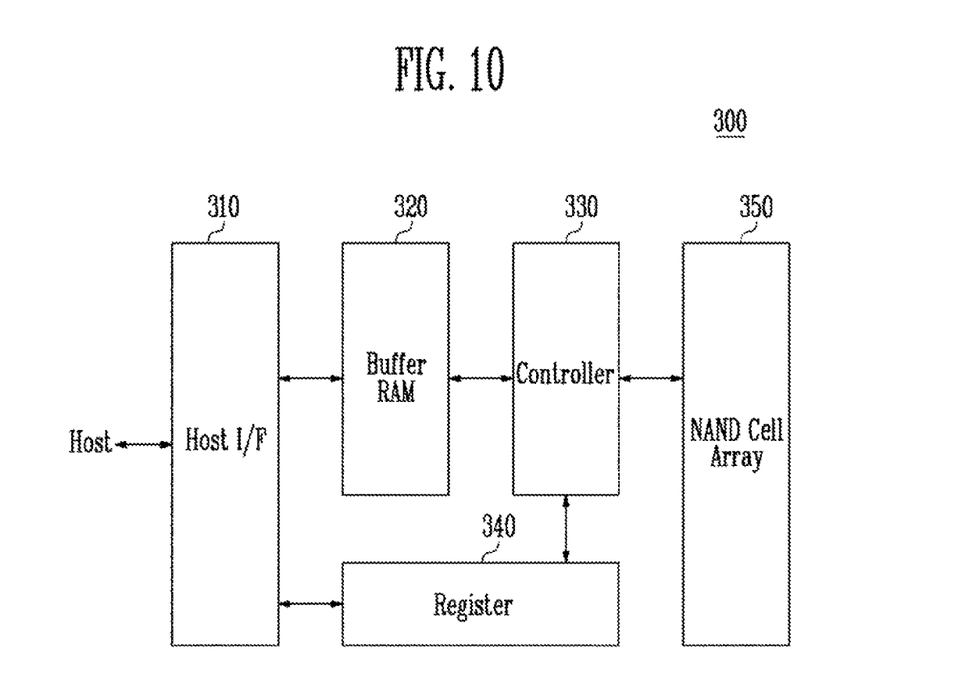
FIG. 10 is a fusion memory device or a fusion memory system performing a program operation according to the embodiment of the present invention.

FIG. 10 is a schematic block diagram illustrating a fusion memory device or a fusion memory system that performs a program operation according to the aforementioned various embodiments. For example, technical features of the present invention may be applied to an OneNand flash memory device 300 as the fusion memory device.

The OneNand flash memory device 300 may include a host interface (I/F) 310, a buffer RAM 320, a controller 330, a register 340 and a NAND flash cell array 350. The host interface 310 may be configured to exchange various types of information with a device through a different protocol. The buffer RAM 320 may have built-in codes for driving the memory device or temporarily storing data. The controller 330 may be configured to control read and program operations in every state in response to a control signal and a command that are externally given. The register 340 may be configured to store data including instructions, addresses and configurations defining a system operating environment in the memory device. The NAND flash cell array 350 may include operating circuits including non-volatile memory cells and page buffers. In response to a write request from a host, the OneNAND flash memory device 300 may program data in the aforementioned manner.

Figure 11:
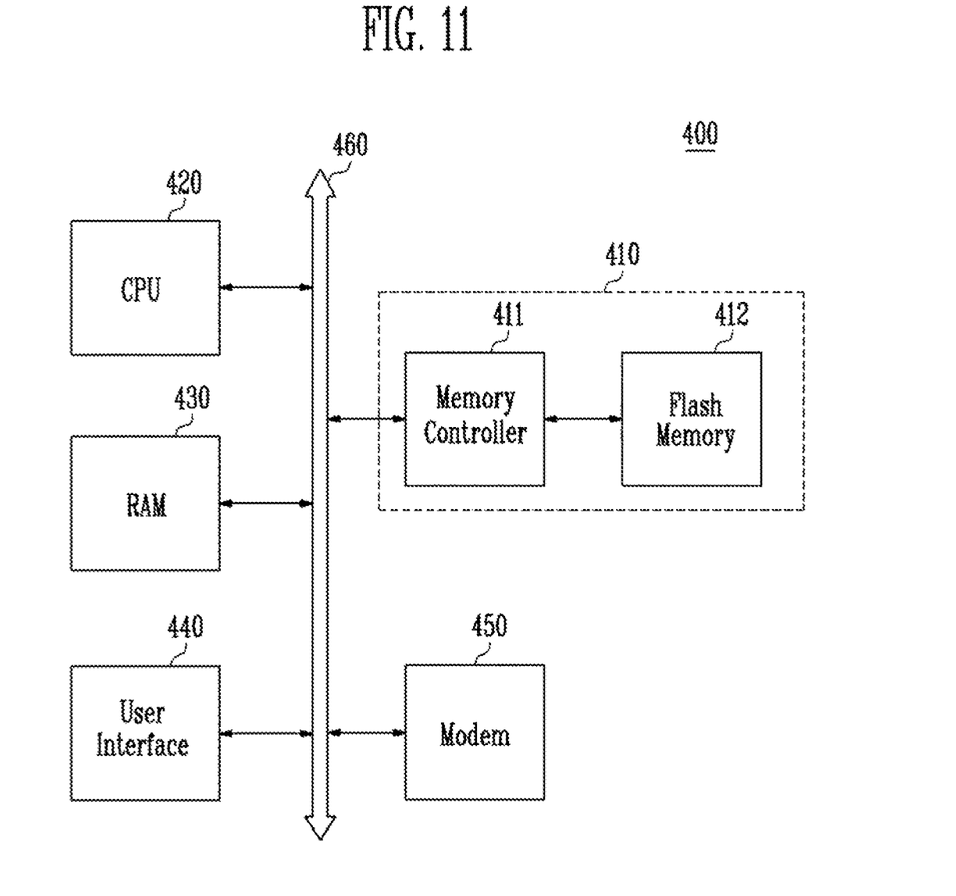
FIG. 11 is a schematic block diagram illustrating a computing system including a flash memory device according to the embodiment of the present invention.

FIG. 11 is a schematic block diagram of a computing system including a flash memory 412 according to an embodiment of the present invention.

A computing system 400 according to an embodiment of the present invention may include a microprocessor (CPU) 420, RAM 430, a user interface 440, a modem 450, such as a baseband chipset, and a memory system 410 that are electrically coupled to a system bus 460. In addition, if the computing system 400 is a mobile device, then a battery may be provided to apply operating voltages to the computing system 400. Though not shown in FIG. 11, the computing system 400 may further include application chipsets, a Camera Image Processor (CIS), or a mobile DRAM. The memory system 410 may form a Solid State Drive/Disk (SSD) that uses a non-volatile memory to store data. The memory system 410 may be provided as a fusion flash memory (e.g., OneNAND) flash memory).

As described above, a semiconductor memory device according to an embodiment of the present invention may arrange a first sense amplifier and a second sense amplifier to a single memory bank and control sensing operations of the first sense amplifier and the second sense amplifier to overlap each other, so that the time margin of the data sensing operation may be ensured to improve speed and reliability of a data output operation.

Various embodiments described above are not limited to a device or method but may be implemented through a program implementing functions corresponding to the features of the embodiments or a non-transitory and computer-readable recording medium where the program is recorded. Such implementation is easily done by a person of ordinary skill in the art based on the description of the embodiments.

Example embodiments have been disclosed herein, and although specific terms are employed, they are used and are to be interpreted in a generic and descriptive sense only and not for the purpose of limiting the present invention. In some instances, as would be apparent to one of ordinary skill in the art as of the filing of the present application, features, characteristics, and/or elements described in connection with a particular embodiment are used singly or in combination with features, characteristics, and/or elements described in connection with other embodiments unless otherwise specifically indicated. Although specific embodiments of the invention have been described, it should be understood that numerous other modifications and various embodiments can be devised by those skilled in the art that will fall within the spirit and scope of the claimed invention as set forth in the following claims.

What is claimed is:

1. A semiconductor memory device, comprising:
a memory cell unit including a plurality of memory banks each including a pair of a first memory bank and a second memory bank;
a sense amplifier group including a plurality of sense amplifier units each including a first sense amplifier and a second sense amplifier coupled to the first memory bank and the second memory bank, respectively; and
a control logic block generating a first column selection signal to transfer data of the first memory bank to the first sense amplifier and a second column selection signal to transfer data of the second memory bank to the second sense amplifier,
wherein an active section of the first column selection signal and an active section of the second column selection signal have different activation timings, and partially overlap each other,
wherein the control logic block receives a bank address signal and activates the first column selection signal and the second column selection signal in response to a rising edge and a falling edge of the bank address signal, respectively.

2. The semiconductor memory device of claim 1, wherein the active section of each of the first column selection signal and the second column selection signal is smaller than a period of the bank address signal and greater than a half period of the bank address signal.

3. The semiconductor memory device of claim 1, wherein the control logic block generates a first strobe signal and a second strobe signal for the first sense amplifier and the second sense amplifier, respectively,
wherein the first sense amplifier senses the data of the first memory bank in response to the first strobe signal when the first column selection signal is activated, and
the second sense amplifier senses the data of the second memory bank in response to the second strobe signal when the second column selection signal is activated.

4. The semiconductor memory device of claim 1, wherein the control logic block includes a column selection signal generation unit generating the first column selection signal and the second column selection signal.

5. The semiconductor memory device of claim 4, wherein the column selection signal generation unit includes:
a control signal generator generating a control signal in response to a bank address signal;
a first column selection signal generator generating the first column selection signal in response to the bank address signal and the control signal; and
a second column selection signal generator generating the second column selection signal in response to the bank address signal and the control signal.

6. The semiconductor memory device of claim 1, wherein each of the first memory bank and the second memory bank comprises:
a memory cell unit including a plurality of memory cells;
a page buffer group sensing data stored in the plurality of memory cells and temporarily storing the data; and
a cache latch group latching data temporarily stored in the page buffer group.

7. The semiconductor memory device of claim 1, wherein the control logic block generates a first strobe signal and a second strobe signal to control sensing operations of the first sense amplifier and the second sense amplifier, respectively.

8. The semiconductor memory device of claim 7, wherein the first strobe signal and the second strobe signal are alternately activated.

9. The semiconductor memory device of claim 1, wherein the first sense amplifier and the second sense amplifier are coupled to a same data line and output transferred data to the same data line.

10. A semiconductor memory device, comprising:
a plurality of memory banks each including first to n-th memory cell groups;
a plurality of sense amplifier groups corresponding to the plurality of memory banks, wherein each of the sense amplifier groups includes first to n-th sense amplifiers; and
a control logic block generating first to n-th column selection signals to transfer data of the first to n-th memory cell groups to the first to n-th sense amplifiers, respectively, wherein active sections of the first to n-th column selection signals have different activation timings, and partially overlap each other,
wherein the control logic block receives a bank address signal and activates each of the first to n-th column selection signals in response to a specified one of a rising edge and a falling edge of the bank address signal.

11. The semiconductor memory device of claim 10, wherein each of the plurality of memory banks further includes:
first to n-th page buffer units corresponding to the first to n-th memory cell groups, respectively, and sensing the data of the first to n-th memory cell groups to transfer sensed data to input/output data lines.

12. The semiconductor memory device of claim 11, wherein each of the plurality of memory banks further includes:

first to n-th latch groups coupled between the first to n-th page buffer units and the input/output data lines and latching data stored in the first to n-th page buffer units.

13. The semiconductor memory device of claim 12, wherein the first to n-th latch groups transfer latched data to the input/output data lines in response to first to n-th column selection signals, respectively.

14. The semiconductor memory device of claim 10, wherein the control logic block includes a column selection signal generation unit generating the first to n-th column selection signals.

15. The semiconductor memory device of claim 14, wherein the column selection signal generation unit includes:
   a control signal generator generating a control signal in response to the bank address signal; and
   first to n-th column selection signal generators generating the first to n-th column selection signals in response to the bank address signal and the control signal.

16. The semiconductor memory device of claim 15, wherein the active section of each of the first to n-th column selection signals is smaller than a period of the bank address signal and greater than a half period of the bank address signal.

* * * * *